United States Patent [19]

Freedman

[11] Patent Number: 4,926,022

[45] Date of Patent: May 15, 1990

[54] LASER REFLOW SOLDERING PROCESS AND BONDED ASSEMBLY FORMED THEREBY

[75] Inventor: Gary M. Freedman, Stow, Mass.

[73] Assignee: Digital Equipment Corporation, Maynard, Mass.

[21] Appl. No.: 368,598

[22] Filed: Jun. 20, 1989

[51] Int. Cl.$^5$ .............................................. B23K 26/00
[52] U.S. Cl. ........................... 219/121.63; 219/121.64
[58] Field of Search ...................... 219/121.63, 121.64, 219/121.6, 121.85, 85.12, 85.22

[56] References Cited

U.S. PATENT DOCUMENTS

| | | | |
|---|---|---|---|
| 3,402,460 | 9/1968 | Smith | 29/589 |
| 3,610,874 | 10/1971 | Gagliano | 219/121.6 |
| 3,718,968 | 3/1973 | Sims et al. | 29/482 |
| 3,952,180 | 4/1976 | Gnanamuthu | 219/121.85 |
| 4,404,453 | 9/1983 | Gotman | 219/121.64 |
| 4,531,044 | 7/1985 | Chang | 219/121.63 X |
| 4,714,815 | 12/1987 | Swarts et al. | 219/121.64 X |

FOREIGN PATENT DOCUMENTS 0107786 6/1984 Japan .............................. 219/121.64

Primary Examiner—C. L. Albritton
Attorney, Agent, or Firm—Nutter, McClennen & Fish

[57] ABSTRACT

A method of reflow soldering an electrical lead to a solder pad using a laser in which the solder pad, rather than the terminal, is irradiated by the laser beam. The pad becomes hot enough to melt the solder which efficiently transfers the thermal energy to the lead. Upon removal of the laser beam, the solder sets forming an intimate electrical and mechanical connection between the common areas of the lead and pad. To practice the process, the solder pad should extend out beyond the portion of the lead in contact with the pad by a distance equal to or exceeding the diameter of the laser beam used in the bonding process.

2 Claims, 1 Drawing Sheet

LASER REFLOW SOLDERING PROCESS AND BONDED ASSEMBLY FORMED THEREBY

This invention relates to laser reflow soldering process. It relates more particularly to an improved process or method of attaching electrical leads to a substrate, printed wiring board, rigid or flexible circuit or the like using a laser and to the bonded assembly formed thereby.

BACKGROUND OF THE INVENTION

A printed wiring board, printed circuit or the like has sites for accepting integrated circuits, transistors and other circuit components. Surrounding each site is an array of electrically conductive bonding pads to which the leads of the component suited to that site are electrically and mechanically connected. Conductor runs connect the various pads to each other and to terminal pads often located at an edge of the printed circuit to connect the circuit to the outside world.

The circuit components often have flat wire leads which extend out from the sides of the component, are bent down more or less 90°, and terminate in a short horizontal foot. In other words, each lead is shaped more or less like the letter L. The positions and dimensions of these leads correspond to the positions and dimensions of the bonding pads around the printed circuit site for that component such that the feet of these leads fit flush on and substantially cover the bonding pads.

FIG. 2 shows a typical component 10 whose lead 12 terminates in a horizontal foot 12a which rests on a bonding pad 14 of a printed circuit 16. The bonding pad 14 consists of a layer 14a of conductive metal, e.g. copper, pre-coated with a thin layer 14b of solder. Conventionally, to bond the lead to the pad, the horizontal lead foot 12a is irradiated by a vertical laser beam L which heats the lead foot sufficiently to remelt the solder and the molten solder transfers the thermal energy to the pad 14. As soon as the laser beam L is removed, the solder solidifies thereby connecting the lead 12 to the pad 14 both electrically and mechanically.

This prior bonding procedure has certain disadvantages. If thermal contact between the lead and the pad is limited as would be the case if the pad is domed, for example, the lead may not be coplanar with or in good thermal contact with the solder pad. In this event, the laser's beam energy may overheat the lead and destroy the inner lead bond or otherwise damage the component before the solder melts.

Also, during the reflow soldering process, the electrical component and its leads are positioned with respect to the printed circuit by a jig or fixture. Since the laser beam is conventionally aimed at the foot of the lead during bonding as shown in FIG. 2, that part of the lead cannot be obscured by hold-down appliances on other parts of the fixture. To maximize the available real estate for these appliances, the parts of the fixture overlying each lead can be made transparent to the laser beam. However, this complicates, and increases the cost of, the fixture.

It should be mentioned also that some of the electrical components bonded to substrates, circuit boards and the like have J-shaped leads. In other words, the end or foot of each lead is curled under the component. If the prior laser bonding process is used to connect components of this type to a printed circuit, the laser must be repositioned so that it delivers the laser beam at an angle to the normal direction against the side of the lead. This requires that the laser be supported by a movable arm or other mount that allows such articulation.

SUMMARY OF THE INVENTION

The present invention aims to provide an improved process or method of effecting laser reflow soldering in electronic printed wiring board, interconnect or subassembly manufacturing. This process minimizes the likelihood of overheating the electrical lead and the component to which it is connected during the bonding and it eliminates the need for transparent fixturing or hold-down appliances in the bonding areas.

As will be described in more detail presently, the invention assures maximum thermal transfer between pad and lead and it helps to compensate for lead-to-pad non-coplanarity due to solder surface tension-induced doming. An ancillary advantage is the elimination of the need to articulate the laser when bonding J-shaped leads.

The invention accordingly comprises the several steps and the relation of one or more of such steps with respect to each of the others, and the article possessing the features, properties and the relation of elements which are exemplified in the following detailed description, and the scope of the invention will be indicated in the claims.

Briefly, in accordance with this invention, instead of making the foot of the electrical lead and the solder pad to which it is to be soldered more or less the same size, the pad is made larger than the foot so that the foot only occupies part of the pad. Then, during the reflow soldering process, the laser beam is aimed at the exposed area of the pad, with the beam being more or less normal to the pad surface for maximum heating effect. The energy from the laser heats the pad and melts the solder on the pad with the result that thermal energy is transferred to the component lead last, causing the molten solder to wet the lead. The molton solder is many times more thermally conductive than solid solder so that efficient transfer of thermal energy from pad to lead over their common surface areas is assured. Upon removal of the laser energy, the lead and pad cool and the solder solidifies to form a firm solder joint between the lead and the pad.

Since the beam exposure time is limited by the short thermal exposure cycle characteristic of laser reflow soldering processes, the bonding pad, being of higher mass than the lead, is much less likely to overheat as compared with the low mass highly conductive lead. Consequently, there is little likelihood of the bonding process weakening or destroying the inner lead bond to the component or damaging the component itself. Also, because the laser beam is aimed at the solder pad rather than the lead, the entire length of the lead is available for contact by the hold-down appliances of the fixture used to position the component during the bonding process. Moreover, the laser energy is delivered to the pad and transferred as thermal energy very efficiently through the highly conductive molton solder to the lead rather than vice versa. Therefore, components with J-shaped leads can be connected to an underlying printed wiring board, substrate, circuit or the like without having to reposition the laser at an angle so that the beam strikes the side of the lead. Also, because the laser heats the pad rather than the lead, my laser reflow soldering technique can be used to bond gold or other highly reflective leads to pads coated with known solder systems for bonding those metals.

Thus, the present process facilitates the laser bonding of electrical leads to the solder pads of substrates, circuit boards and the like. Yet, the process does not involve any appreciable increase in cost since the added metal required to increase the solder pad size by the necessary amount to practice the invention is minimal at most. This process is particularly applicable to so-called tape automated bonded (TAB) also known as chip on tape (COT) assemblies described in detail in application Ser. No. 162,671, filed Mar. 1, 1988, entitled METHOD AND APPARATUS FOR PACKAGING AND COOLING INTEGRATED CIRCUIT CHIPS, which application is assigned to the assignee of this application and incorporated herein by reference.

BRIEF DESCRIPTION OF THE DRAWING

Reference should be had to the following detailed description, taken in connection with the accompanying drawing, in which.

DESCRIPTION OF THE PREFERRED EMBODIMENT

Figure 1:
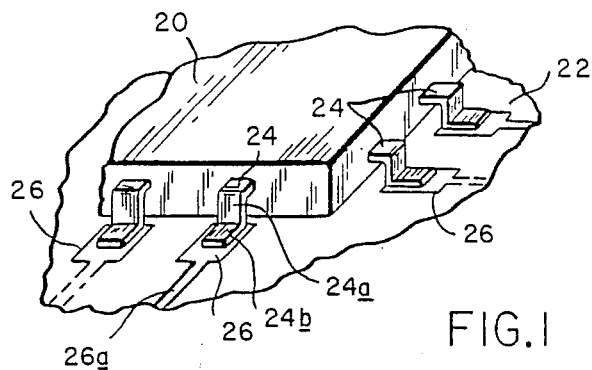
FIG. 1 is a fragmentary isometric view of an integrated circuit component bonded to a printed wiring board by a laser bonding process according to this invention.
Figure 2:
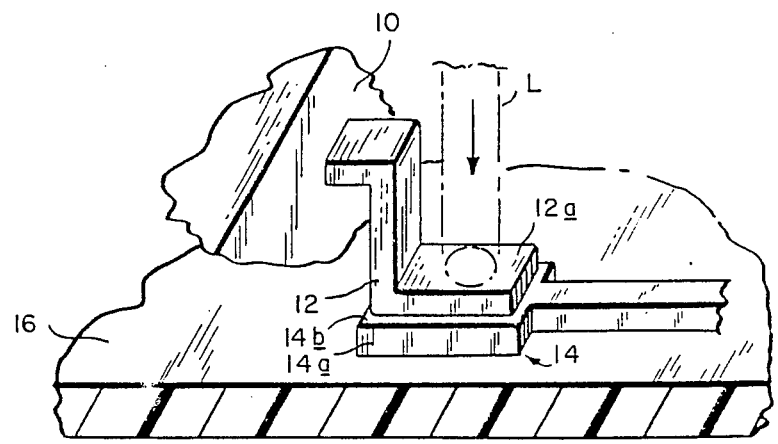
FIG. 2, already described, is a fragmentary isometric view on a much larger scale showing a conventional laser bonding process and the resultant bonded assembly.

Refer now to FIG. 1 of the drawing, which shows a circuit component 20, e.g. an integrated circuit chip, mounted to a printed circuit 22, e.g. a printed circuit of the type described in the above referenced patent application. Component 20 may have an array of flat wire leads or terminals 24 extending out from the sides of the component, each lead having a generally vertical leg 24a and a generally horizontal free end or foot 24b. When component 20 is positioned properly relative to circuit 22, each lead foot sits on a correspondingly positioned solder pad 26 of circuit 22, each pad terminating an electrical conductor run 26a extending along circuit 22. Although in some cases these conductor runs 26a are on the surface of circuit 22, in many instances, they are embedded in the circuit substrate.

Figure 3:
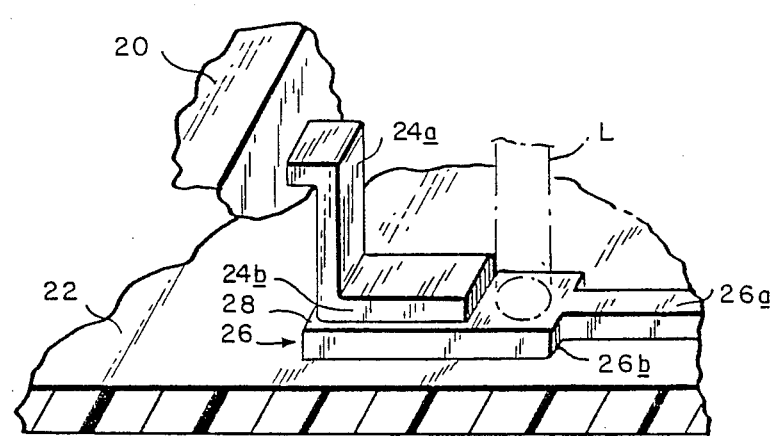
FIG. 3 is a similar view showing the invention laser bonding process and the resultant bonded assembly.

As best seen in FIG. 3, pad 26 is made longer than the overlying lead foot 24b so that a pad area 26b projects out beyond the foot a distance which is preferably at least as great as the terminal diameter of the laser beam L used to bond the lead to circuit 22. This terminal diameter is defined as the beam diameter at the point where the beam impinges the lead foot 24b. As usual, the top surface of pad 26, or at least the area thereof under foot 24b, is covered by a thin layer of solder 28.

To connect lead 24 to pad 26 once the component 20 is seated on circuit 22 by its fixture (not shown), a laser beam L is directed, usually vertically, to the exposed pad portion 26b rather than to the foot 24b of lead 24. For example, a continuous wave Nd:YAG laser will produce a suitable beam L. The pad portion 26b absorbs the laser energy and becomes hot enough to remelt the solder layer 28. The molten solder being many times more conductive than the solid metal transfers the thermal energy very efficiently to the foot of lead 24. Since the solder melts before any appreciable thermal energy is transferred to lead 24 and since the lead foot 24b is pressed tightly against pad 26, the foot and pad are assuredly coplanar. Accordingly, when the solder sets, the lead foot and pad will be bonded securely both electrically and mechanically over their entire common areas, assuring an effective and intimate electrical and mechanical connection between the lead and the pad.

It will be appreciated also that the transfer of thermal energy occurs from the relatively massive pad to the thinner more delicate lead rather than vice versa. Resultantly, the molten solder serves as a compliant thermal transfer agent to thoroughly heat the component lead 24 during bonding. This minimizes the likelihood of excessive heating of the lead 24 and the component 20 connected thereto. Still further, since the laser beam L is aimed at the pad portion 26b rather than at the lead 24, the entire length of the lead, including lead foot 24b, can be contacted by the hold-down appliance of the fixture or jig that positions component 20 on circuit 22. Moreover, the hold-down appliance does not have to be transparent to the laser beam. For the same reason, the laser beam L can be used to bond an electrical lead having a J-shaped configuration to pad 26 without having to mount the laser for articulation from the normal direction. Just as with lead 24, thermal energy will be conducted along pad 26 and, via the molten solder, to the inwardly curved foot of the J-shaped lead thereby producing the same beneficial results described above.

It is apparent that certain changes may be made in carrying out the above process and in the described bonded assembly or article without departing from the scope of the invention. For example, the lead foot 24b can be wider rather than longer than pad 26 to expose the pad to laser beam L. Therefore, it is intended that all matter contained in the above description or shown in the accompanying drawing shall be interpreted as illustrative and not in a limiting sense.

It is also to be understood that the following claims are intended to cover all of the generic and specific features of the invention herein described.

I claim:

1. A method of laser bonding a lead to a circuit contact pad comprising the steps of:
    sizing the pad and lead relatively such that the lead can seat on a contact area of the pad which is less than the total pad area leaving a portion of the pad exposed;
    applying a solder coating to said pad contact area;
    momentarily directing a laser beam at a target area on said pad exposed portion which area is spaced from said contact area thereon so as to heat the pad to a temperature higher than the melting point of the solder, but less than the melting point of the pad so that the lead is heated last by thermal conduction through the solder.

2. A lead-contact pad assembly formed by
    sizing the lead and pad relatively such that the lead can seat on a contact area of the pad which is less than the total pad area, leaving a portion of the pad exposed;
    applying a solder coating to said pad contact area;
    momentarily directing a laser beam at a target area on said pad exposed portion which is spaced from said contact area thereon so as to heat the pad to a temperature higher than the melting point of the solder, but less than the melting point of the pad so that the lead is heated last by thermal conduction through the solder.

* * * * *